United States Patent
Patterson et al.

(10) Patent No.: US 10,475,685 B2
(45) Date of Patent: Nov. 12, 2019

(54) SUBSTRATE LOADING SYSTEM

(71) Applicant: Molecular Imprints, Inc., Austin, TX (US)

(72) Inventors: Roy Matthew Patterson, Hutto, TX (US); Yaseer A. Ahamed, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 186 days.

(21) Appl. No.: 15/717,482

(22) Filed: Sep. 27, 2017

(65) Prior Publication Data

US 2018/0122657 A1     May 3, 2018

Related U.S. Application Data

(60) Provisional application No. 62/416,916, filed on Nov. 3, 2016.

(51) Int. Cl.
    *H01L 21/677*     (2006.01)
    *G03F 7/00*     (2006.01)

(52) U.S. Cl.
    CPC ........ *H01L 21/6779* (2013.01); *G03F 7/0002* (2013.01)

(58) Field of Classification Search
    CPC ... G03F 7/0002; G03F 7/707; H01L 21/6779; H01L 21/67796; H01L 21/68
See application file for complete search history.

(56) References Cited

U.S. PATENT DOCUMENTS

| | | | |
|---|---|---|---|
| 5,510,723 A | 4/1996 | Canella et al. | |
| 10,025,202 B2 * | 7/2018 | Patterson | G03F 7/0002 |
| 10,317,806 B2 * | 6/2019 | Patterson | G03F 7/0002 |
| 2005/0155554 A1 | 7/2005 | Saito | |
| 2006/0054656 A1 | 3/2006 | Narita et al. | |
| 2010/0192992 A1 | 8/2010 | Toshima et al. | |
| 2013/0182236 A1 | 7/2013 | De Schiffart et al. | |
| 2016/0288403 A1 * | 10/2016 | Schumaker | G03F 7/0002 |

OTHER PUBLICATIONS

International Search Report and Written Opinion for International Application No. PCT/US2017/053706, dated Nov. 30, 2017, 17 pages.

* cited by examiner

*Primary Examiner* — David H Banh

(74) *Attorney, Agent, or Firm* — Fish & Richardson P.C.

(57) ABSTRACT

Methods, systems, and apparatus for a substrate transfer method, including positioning a tray handler device in a first position with i) cutouts of an aperture of the first tray in superimposition with respective pedestals of a pedestal platform and ii) a distal end of the pedestals extending away from a top surface of the first tray; increasing a distance between the top surface of the first tray and a top surface of the pedestal platform to transfer a first substrate from the pedestals to the tabs defined by the aperture of the first tray, while concurrently engaging the second tray handler with the second tray; and increasing a distance between the top surface of the second tray and the bottom surface of a chuck to transfer a second substrate from the chuck to the tabs defined by the second tray.

13 Claims, 12 Drawing Sheets

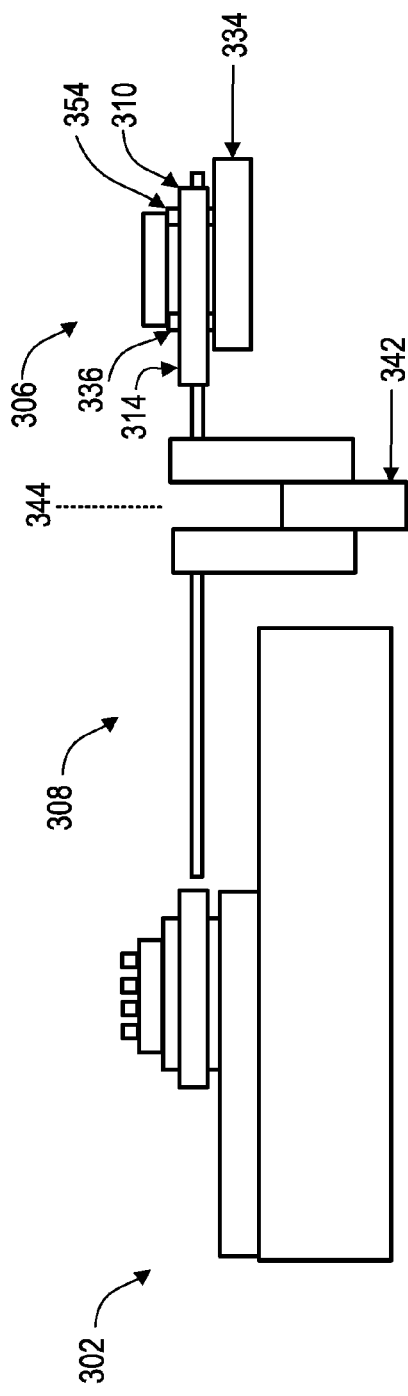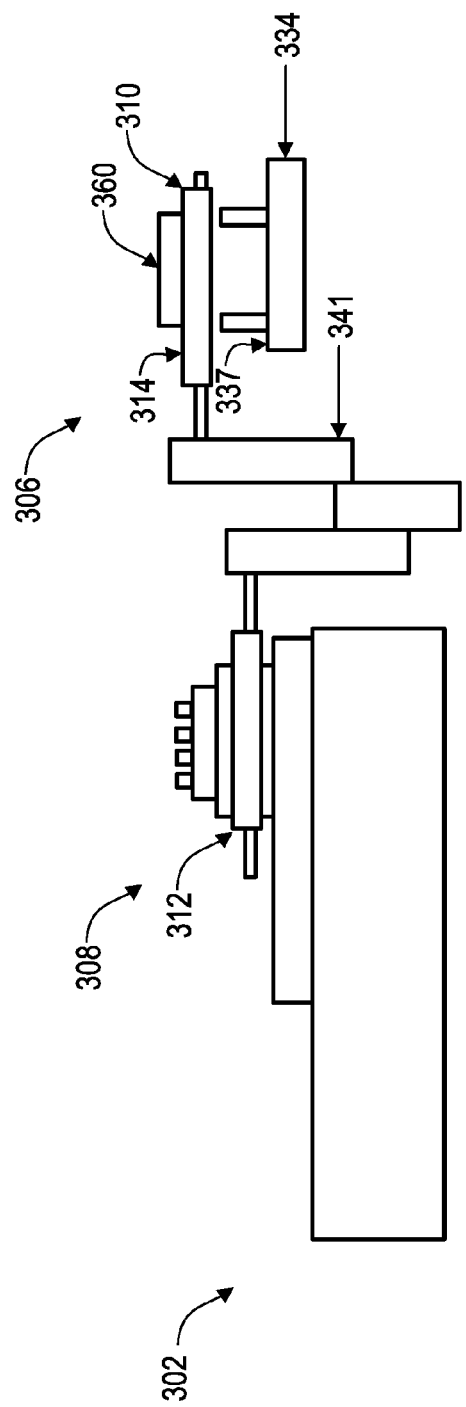

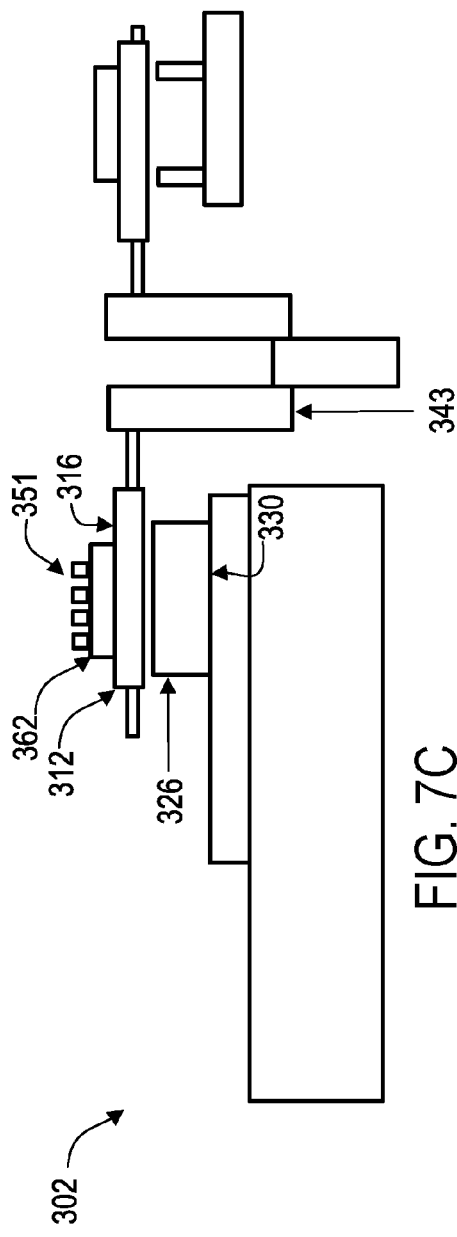
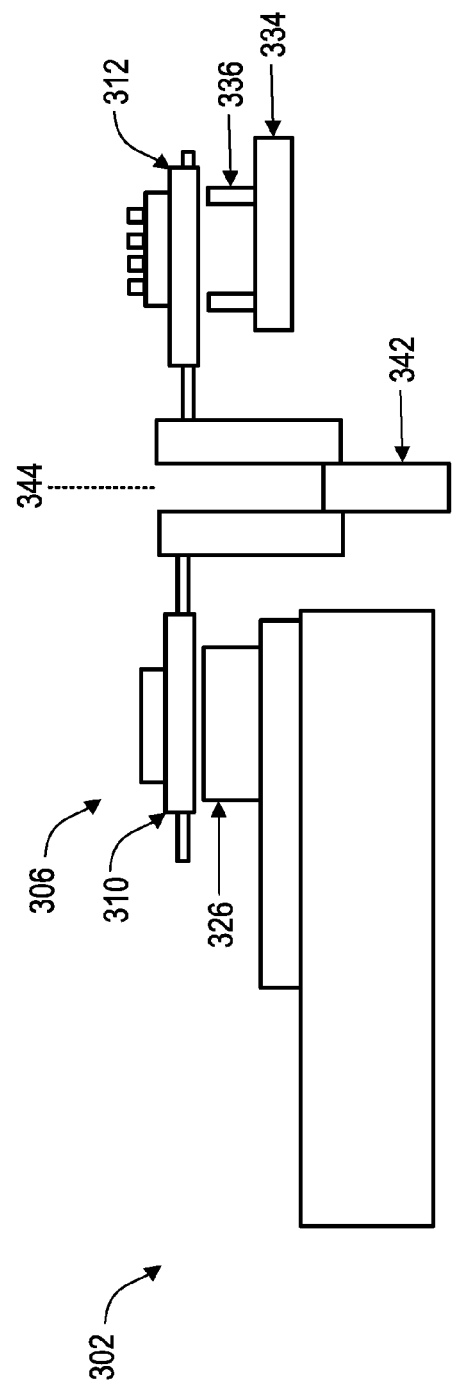

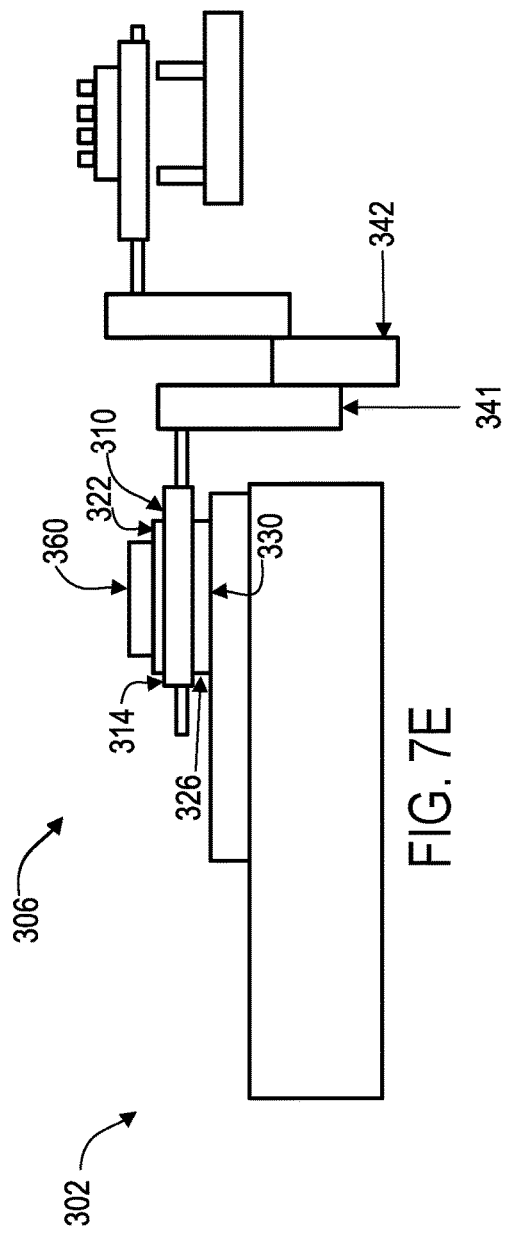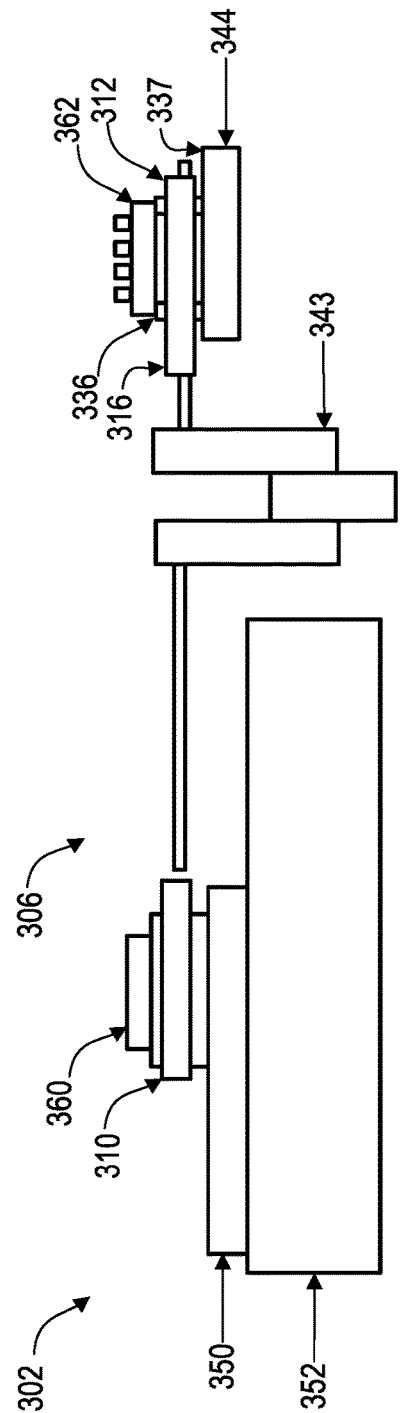

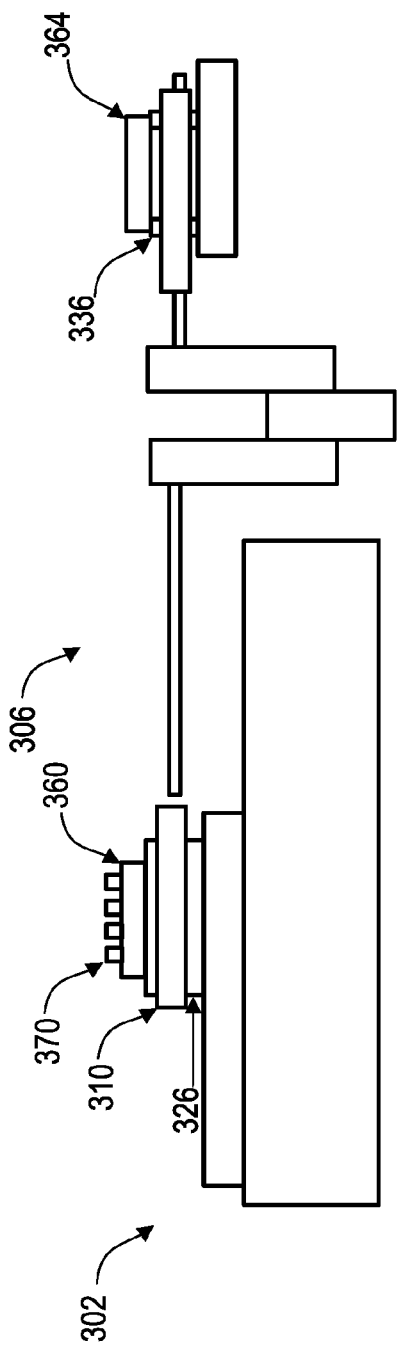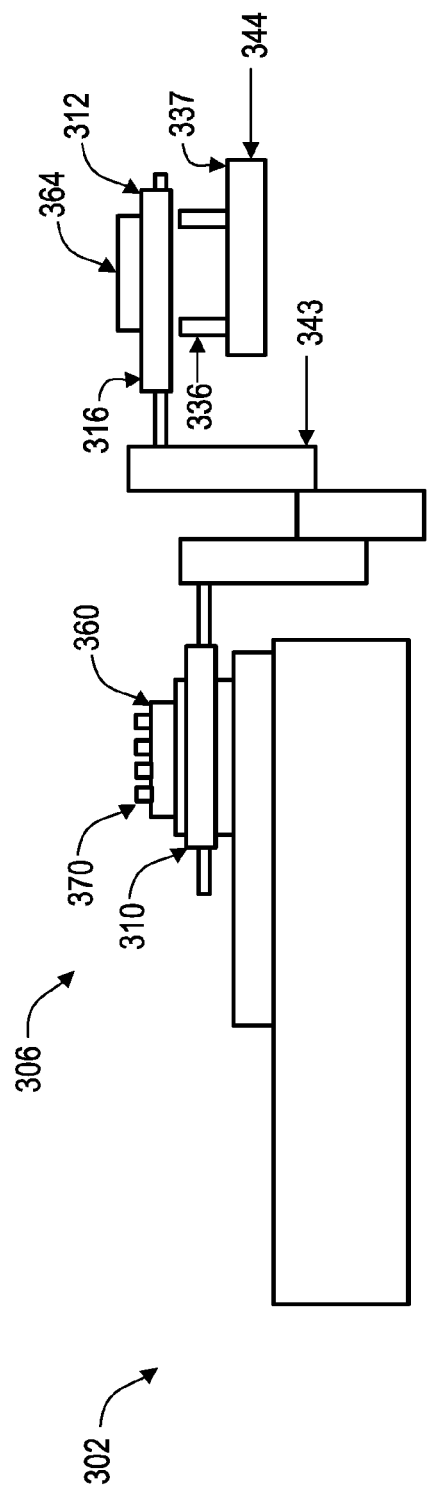

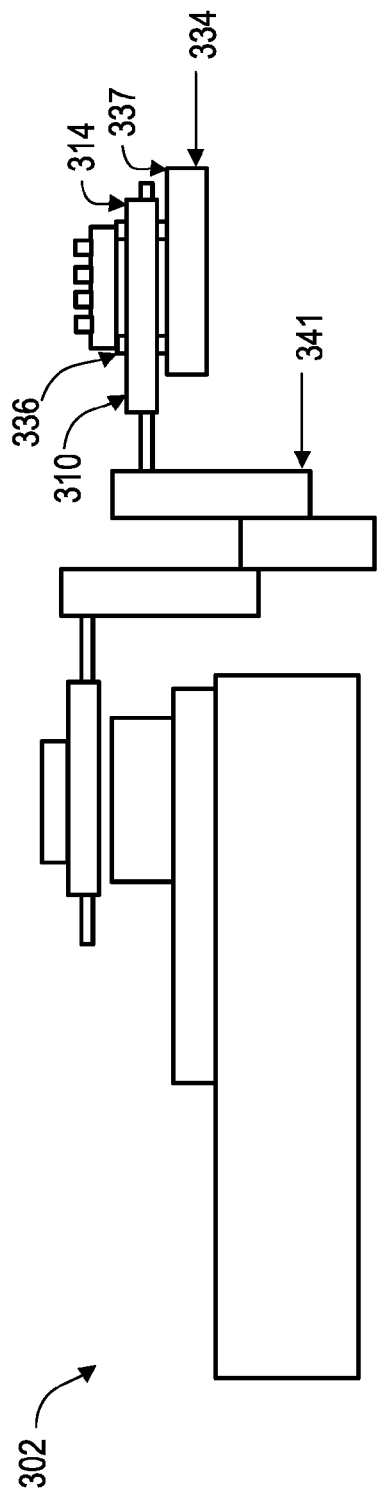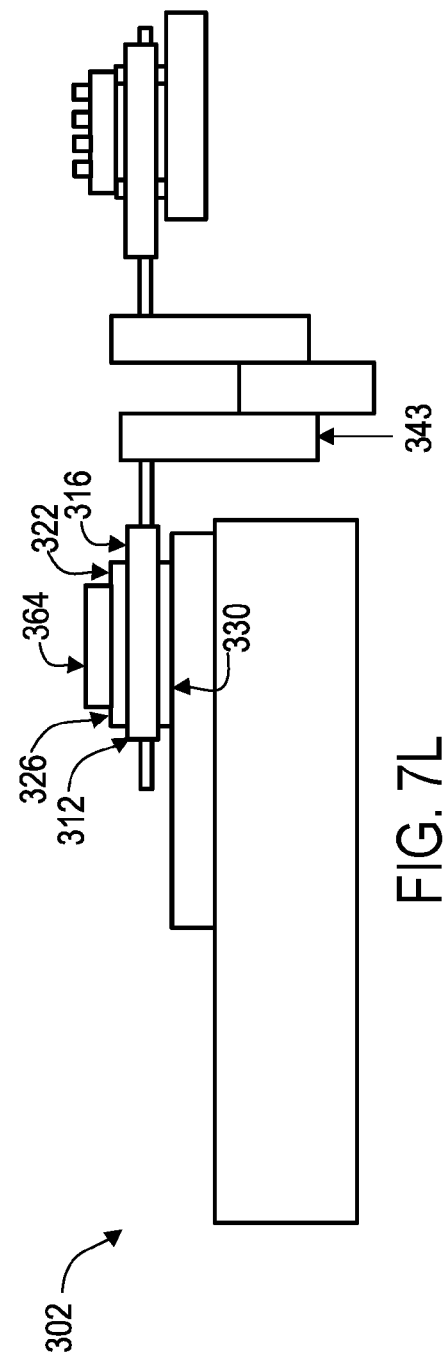

SUBSTRATE LOADING SYSTEM

CROSS-REFERENCE TO RELATED APPLICATION

This application claims the benefit of the filing date of U.S. Provisional Application No. 62/416,916, filed on Nov. 3, 2016. The contents of U.S. Application No. 62/416,916 are incorporated herein by reference in their entirety.

TECHNICAL FIELD

This invention relates to the loading of substrates, such as semiconductor wafers, in systems and methods involving microlithography and similar nano-fabrication techniques.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

However, transportation of substrates throughout different modules of a nano-fabrication system can affect throughput of the system. Improving the transportation of the substrates can result in lowering loading/unloading times of the substrates, and increase throughput, which is desirable.

SUMMARY

Innovative aspects of the subject matter described in this specification may be embodied in methods that include the actions of providing a tray handler device including a first tray handler positioned opposite a second tray handler; providing a first tray and a second tray, each of the first and the second trays defining an aperture and each having a top surface, each aperture defining at least two cutouts and two tabs; providing a substrate chuck having a top surface and a bottom surface; engaging the first tray handler with the first tray; positioning the tray handler device in a first position with i) the cutouts of the aperture of the first tray in superimposition with respective pedestals of a pedestal platform and ii) a distal end of the pedestals extending away from the top surface of the first tray; increasing a distance between the top surface of the first tray and a top surface of the pedestal platform to transfer a first substrate from the pedestals to the tabs defined by the aperture of the first tray, while concurrently engaging the second tray handler with the second tray; increasing a distance between the top surface of the second tray and the bottom surface of the substrate chuck to transfer a second substrate from the substrate chuck to the tabs defined by the second tray; rotating the tray handler device from the first position to a second position with i) the tabs defined by the aperture of the first tray in superimposition with respective channels of the substrate chuck and ii) the cutouts of the aperture of the second tray in superimposition with respective pedestals; decreasing a distance between the top surface of the first tray and the bottom surface of the substrate chuck to transfer the first substrate from the tabs defined by the aperture of the first tray to the top surface of the substrate chuck while the tabs defined by the aperture of the first tray are disposed within the respective channels of the substrate chuck; and disengaging the first tray handler from the first tray while concurrently decreasing a distance between the top surface of the second tray and the top surface of the pedestal platform to transfer the second substrate from the tabs defined by the aperture of the second tray to the pedestals.

Other embodiments of these aspects include corresponding systems and apparatus.

These and other embodiments may each optionally include one or more of the following features. For instance, removing the second substrate from being positioned on the pedestals; positioning a third substrate on the pedestals; and after disengaging the first tray handler from the first tray, forming a pattern in a material positioned on the first substrate while the first substrate is positioned on the substrate chuck and the first tray is coupled with the substrate chuck. After forming the pattern in the material positioned on the first substrate, engaging the first tray handler with the first tray while concurrently increasing the distance between the top surface of the second tray and the top surface of the pedestal platform to transfer the third substrate from the pedestals to the tabs defined by the aperture of the second tray. After engaging the first tray handler with the first tray, increasing the distance between the top surface of the first tray and the bottom surface of the substrate chuck to transfer the first substrate from the substrate chuck to the tabs of defined by the first tray. After increasing the distance between the top surface of the first tray and the bottom surface of the substrate chuck, rotating the tray handler device from the second position to the first position with the cutouts of the aperture of the first tray in superimposition with respective pedestals of the pedestal platform. Decreasing the distance between the top surface of the first tray and the top surface of the pedestal platform to transfer the first substrate from the tabs defined by the aperture of the first tray to the pedestals. Decreasing the distance between the top surface of the second tray and the bottom surface of the substrate chuck to transfer the third substrate from the tabs defined by the aperture of the second tray to the top surface of the substrate chuck while the tabs defined by the aperture of the second tray are disposed within the respective channels of the substrate chuck. The second substrate includes a patterned layer positioned thereon prior to transfer ring the second substrate from the substrate chuck to the tabs defined by the second tray.

Innovative aspects of the subject matter described in this specification may be embodied in systems that include two or more pedestals of a pedestal platform; a substrate chuck having a top surface and a bottom surface, and including channels; a first tray and a second tray, each of the first and the second trays defining an aperture and each having a top surface, each aperture defining at least two cutouts and two tabs; a tray handler device including a first tray handler positioned opposite a second tray handler, the first tray handler engageable with the first tray and the second tray handler engageable with the second tray, the tray hander rotatable between first and second positions, the first position having i) the cutouts of the aperture of the first tray in superimposition with respective pedestals of a pedestal platform and ii) a distal end of the pedestals extending away from the top surface of the first tray, the second position having i) the tabs defined by the aperture of the first tray in superimposition with respective channels of the substrate chuck and ii) the cutouts of the aperture of the second tray in superimposition with respective pedestals; and an actuator system to, when the tray handler device is in the first position, i) increase a distance between the top surface of the first tray and a top surface of the pedestal platform to transfer a first substrate from the pedestals to the tabs defined by the aperture of the first tray, while concurrently engaging the second tray handler with the second tray, and ii) increase a distance between the top surface of the second tray and the bottom surface of the substrate chuck to transfer a second substrate from the substrate chuck to the tabs defined by the second tray, and when the tray handler is in the second position, i) decrease a distance between the top surface of the first tray and the bottom surface of the substrate chuck to transfer the first substrate from the tabs defined by the aperture of the first tray to the top surface of the substrate chuck while the tabs defined by the aperture of the first tray are disposed within the respective channels of the substrate chuck, and ii) decrease a distance between the top surface of the second tray and the top surface of the pedestal platform to transfer the second substrate from the tabs defined by the aperture of the second tray to the pedestals while the first tray handler is disengaged from the first tray.

Other embodiments of these aspects include corresponding methods.

These and other embodiments may each optionally include one or more of the following features. For instance, the system comprising a rotational system to rotate the tray handler device between the first and the second positions. The system comprising a patterning system to form a pattern in the first substrate when the first substrate is positioned on the top surface of the substrate chuck. The actuator system comprising a first actuator module, the first actuator module, when the tray handler device is in the first position, increase the distance between the top surface of the first tray and a top surface of the pedestal platform to transfer a first substrate from the pedestals to the tabs defined by the aperture of the first tray, while concurrently engaging the second tray handler with the second tray, and when the tray handler device is in the second position, decrease the distance between the top surface of the first tray and the bottom surface of the substrate chuck to transfer the first substrate from the tabs defined by the aperture of the first tray to the top surface of the substrate chuck while the tabs defined by the aperture of the first tray are disposed within the respective channels of the substrate chuck. The actuator system comprising a second actuator module, the second actuator module, when the tray handler is in the first position, increase a distance between the top surface of the second tray and the bottom surface of the substrate chuck to transfer a second substrate from the substrate chuck to the tabs defined by the second tray, and when the tray handler is in the second position, and when the tray handler device is in the second position, decrease the distance between the top surface of the second tray and the top surface of the pedestal platform to transfer the second substrate from the tabs defined by the aperture of the second tray to the pedestals while the first tray handler is disengaged from the first tray.

Particular implementations of the subject matter described in this specification can be implemented so as to realize one or more of the following advantages. Implementations of the present disclosure may improve the transportation of substrates resulting in lowering loading/unloading times of the substrates, and increased throughput.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF DRAWINGS

FIGS. 7A-7L illustrate simplified side views of the substrate loading system, including loading and unloading of substrates to and from pedestals and the substrate chuck.

DETAILED DESCRIPTION

This document describes methods and systems that provide loading and unloading of substrates to and from pedestals and substrate chucks. Specifically, a tray handler device is provided that includes a first tray handler positioned opposite a second tray handler. A first tray and a second tray are provided, each of the first and the second trays defining an aperture and each having a top surface, each aperture defining at least two cutouts and two tabs. A substrate chuck is provided having a top surface and a bottom surface. The first tray handler engages with the first tray. The tray handler device is positioned in a first position with i) the cutouts of the aperture of the first tray in superimposition with respective pedestals of a pedestal platform and ii) a distal end of the pedestals extending away from the top surface of the first tray. A distance is increased between the top surface of the first tray and a top surface of the pedestal platform to transfer a first substrate from the pedestals to the tabs defined by the aperture of the first tray, while concurrently engaging the second tray handler with the second tray. A distance is increased between the top surface of the second tray and the bottom surface of the substrate chuck to transfer a second substrate from the substrate chuck to the tabs defined by the second tray.

The tray handler device is rotated from the first position to a second position with i) the tabs defined by the aperture of the first tray in superimposition with respective channels of the substrate chuck and ii) the cutouts of the aperture of the second tray in superimposition with respective pedestals. A distance is decreased between the top surface of the first tray and the bottom surface of the substrate chuck to transfer the first substrate from the tabs defined by the aperture of the first tray to the top surface of the substrate chuck while the tabs defined by the aperture of the first tray are disposed within the respective channels of the substrate chuck. The first tray handler is disengaged from the first tray while concurrently decreasing a distance between the top surface of the second tray and the top surface of the pedestal platform to transfer the second substrate from the tabs defined by the aperture of the second tray to the pedestals.

Figure 1:
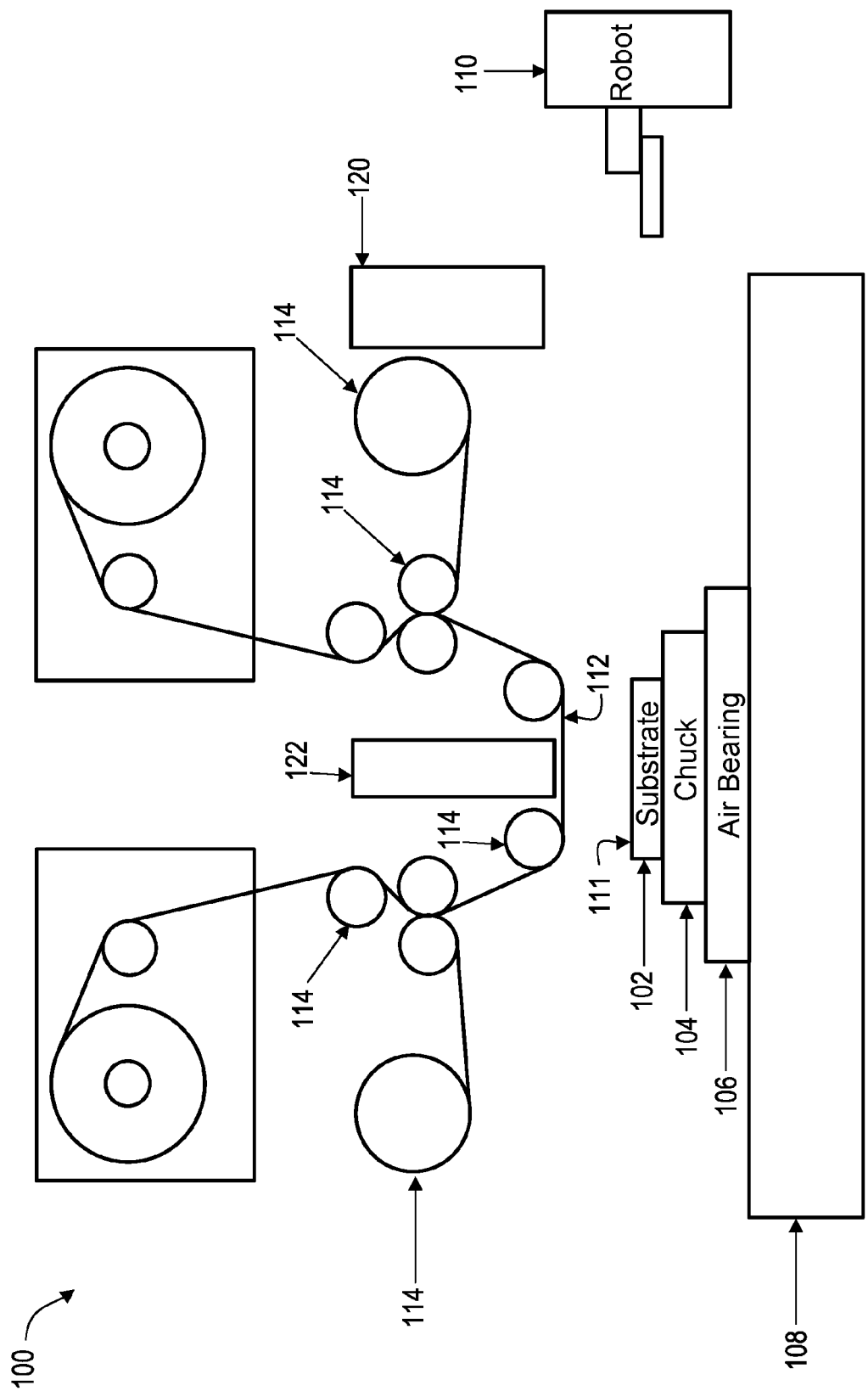
FIG. 1 illustrates a simplified side view of a lithographic system.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. In some examples, the substrate 102 and the substrate chuck 104 may be further positioned on an air bearing 106. The air bearing 106 provides motion about the x-, y-, and/or z-axes. In some examples, the substrate 102 and the substrate chuck 104 are positioned on a stage. The air bearing 106, the substrate 102, and the substrate chuck 104 may also be positioned on a base 108. In some examples, a robotic system 110 positions the substrate 102 on the substrate chuck 104.

The imprint lithography system 100 further includes an imprint lithography flexible template 112 that is coupled to one or more rollers 114, depending on design considerations. The rollers 114 provide movement of a least a portion of the flexible template 112. Such movement may selectively provide different portions of the flexible template 112 in superimposition with the substrate 102. In some examples, the flexible template 112 includes a patterning surface that includes a plurality of features, e.g., spaced-apart recesses and protrusions. However, in some examples, other configurations of features are possible. The patterning surface may define any original pattern that forms the basis of a pattern to be formed on substrate 102. In some examples, the flexible template 112 may be coupled to a template chuck, e.g., a vacuum chuck, a pin-type chuck, a groove-type chuck, an electromagnetic chuck, and/or the like.

The imprint lithography system 100 may further comprise a fluid dispense system 120. The fluid dispense system 120 may be used to deposit a polymerizable material on the substrate 102. The polymerizable material may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material is positioned upon the substrate 102 as a plurality of droplets.

Figure 2:
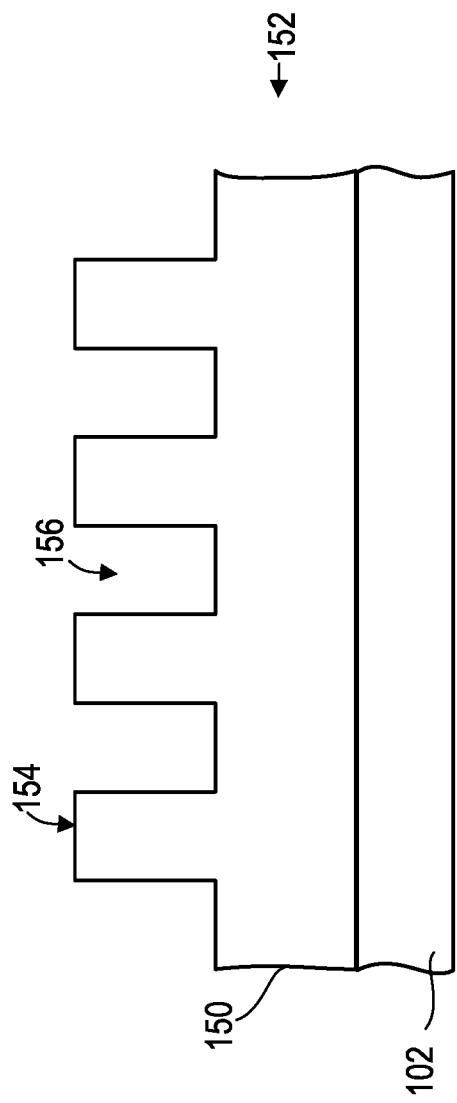
FIG. 2 illustrates a simplified side view of a substrate having a patterned layer positioned thereon.

Referring to FIGS. 1 and 2, the imprint lithography system 100 may further comprise an energy source 122 coupled to direct energy towards the substrate 102. In some examples, the rollers 114 and the air bearing 106 are configured to position a desired portion of the flexible template 112 and the substrate 102 in a desired positioning. The imprint lithography system 100 may be regulated by a processor in communication with the air bearing 106, the rollers 114, the fluid dispense system 120, and/or the energy source 122, and may operate on a computer readable program stored in a memory.

In some examples, the rollers 114, the air bearing 106, or both, vary a distance between the flexible template 112 and the substrate 102 to define a desired volume therebetween that is filled by the polymerizable material. For example, the flexible template 112 contacts the polymerizable material. After the desired volume is filled by the polymerizable material, the energy source 122 produces energy, e.g., broadband ultraviolet radiation, causing the polymerizable material to solidify and/or cross-link conforming to shape of a surface of the substrate 102 and a portion of the patterning surface of the flexible template 122, defining a patterned layer 150 on the substrate 102. In some examples, the patterned layer 150 may comprise a residual layer 152 and a plurality of features shown as protrusions 154 and recessions 156.

Figure 3:
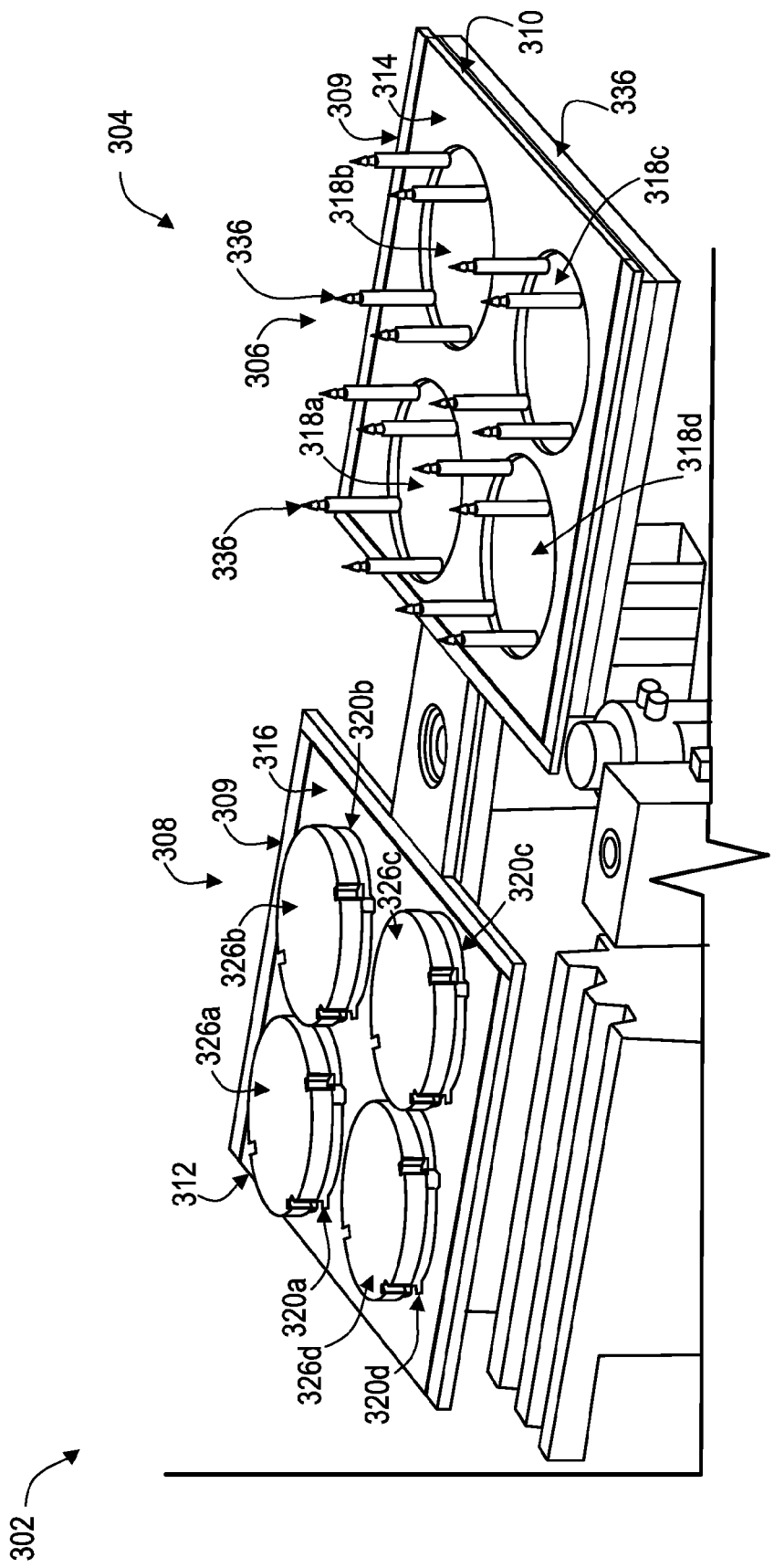
FIG. 3 illustrates a perspective view of a substrate loading system, including a tray handler device.

FIG. 3 illustrates a perspective view of a substrate loading system 302. In short, the substrate loading system 302 facilitates loading and unloading of substrates to and from one or more stations (e.g., pedestals and/or substrate chucks). The substrate loading system 302 includes a tray handler device 304 including a first tray handler 306 positioned opposite a second tray handler 308. In some examples, the first tray handler 306 and the second tray handler 308 can include one or more arms 309.

Figure 4:
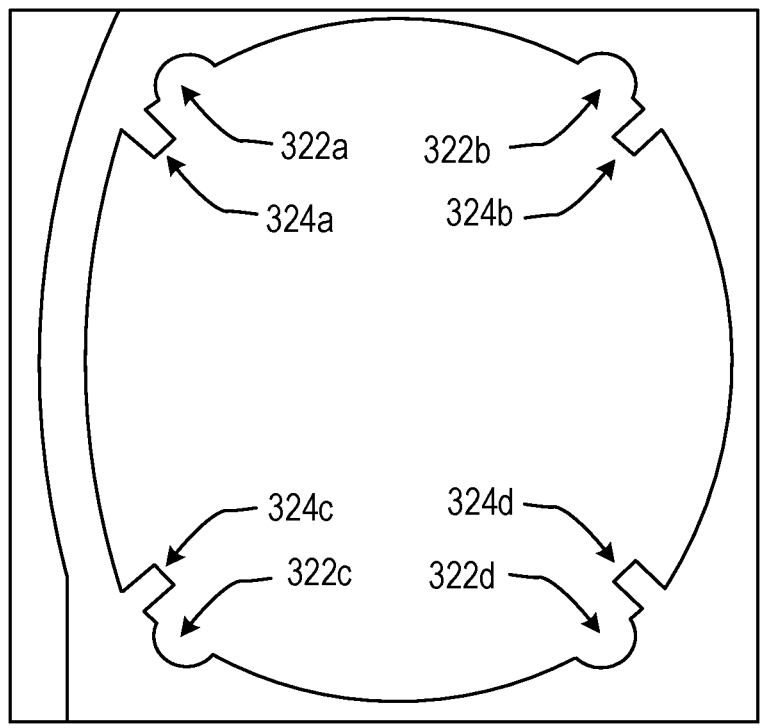
FIG. 4 illustrates a top down view of one of a portion of the tray handler device.

The substrate loading system 302 further includes a first tray 310 and a second tray 312. The first tray 310 and the second tray 312 each have a top surface 314, 316, respectively. Further, the first tray 310 defines apertures 318a, 318b, 318c, 318d (collectively referred to as apertures 318) and the second tray 312 defines apertures 320a, 320b, 320c, 320d (collectively referred to as apertures 320). However, the first tray 310 and the second tray 312 can define any number of apertures. Each of the apertures 318, 320 define cutouts and tabs. Specifically, FIG. 4 illustrates a top down view of one of the apertures 318, 320 that includes cutouts 322a, 322b, 322c, 322d (collectively referred to as cutouts 322) and tabs 324a, 324b, 324c, 324d (collectively referred to as tabs 324). However, each of the apertures 318, 320 can include any number of cutouts 322 and tabs 324. In some examples, the tabs 324 include a high friction material positioned thereon, such as Viton® (available from The Chemours Company), Kalrez® (available from the DuPont™), or Simriz® (available from Freudenberg Sealing Technologies).

Figure 5:
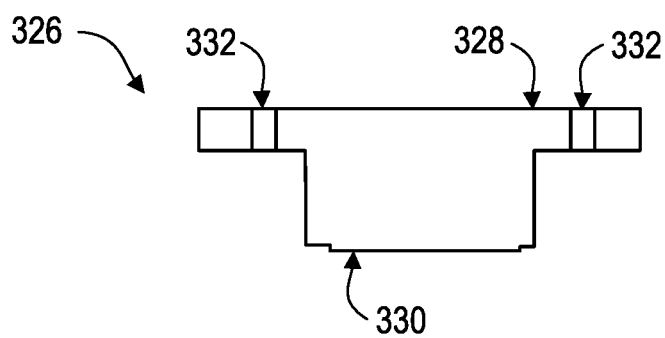
FIG. 5 illustrates a side view of a substrate chuck.

The substrate loading system 302 further includes substrate chucks 326a, 326b, 326c, 326d (collectively referred to as substrate chucks 326); however, the system 302 can include any number of substrate chucks 326. FIG. 5 illustrates a side view of one of the substrate chucks 326. The substrate chuck 326 includes a top surface 328 positioned opposite a bottom surface 330. The substrate chuck 326 also includes channels 332 positioned at a perimeter of each substrate chuck 326. In some examples, for a particular aperture 318, 320, the quantity of the channels 332 matches the quantity of the tabs 324 of the particular aperture 318, 320. The substrate loading system 302 further includes a pedestal platform 334 that includes a plurality of pedestals 336 extending from a top surface 337, shown in FIG. 6. In some examples, a first subset of the pedestals 336 can be associated with a first height, and a second subset of the pedestals 336 can be associated with a second height.

Figure 6:
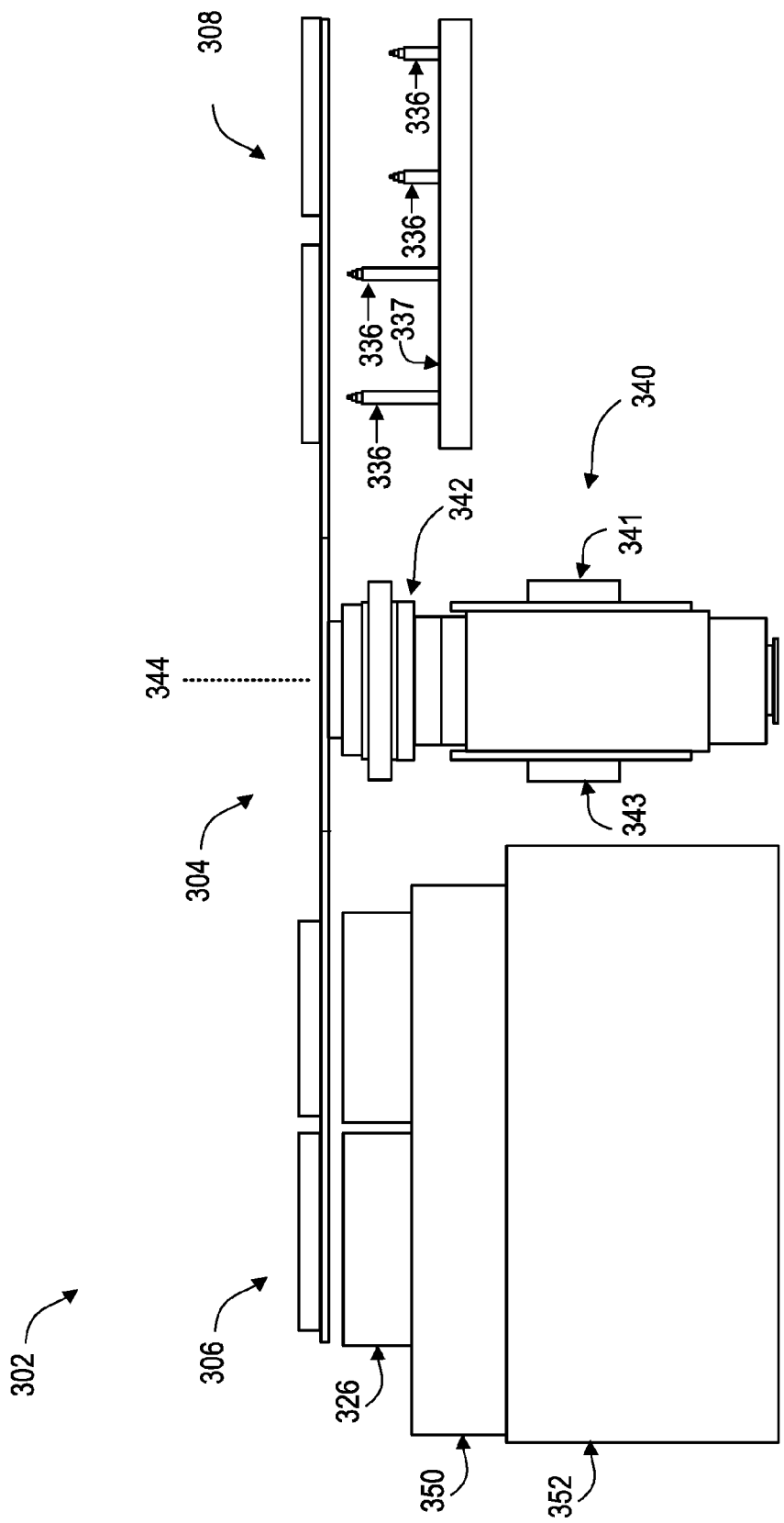
FIG. 6 illustrates a side view of the substrate loading system.

Referring to FIG. 6, a side view of the substrate loading system 302 is shown. The substrate loading system 302 further includes an actuator system 340 and a rotational system 342. In some examples, the actuator system 340 includes a first actuator module 341 and a second actuator module 343. The actuator system 340 increases and/or decreases a relative positioning of the tray handler device 304, and specifically, the first tray handler 306 and the second tray handler 308, with respect to the substrate chucks 326 and the pedestals 336. The rotational system 342 rotates the tray handler device 304 with respect to an axis 344. The substrate loading system 302 further includes an air bearing 350 and a support structure 352. In some examples, the air bearing 350 facilitates movement of the substrate chucks 326 about the support structure 352.

Figure 7I:
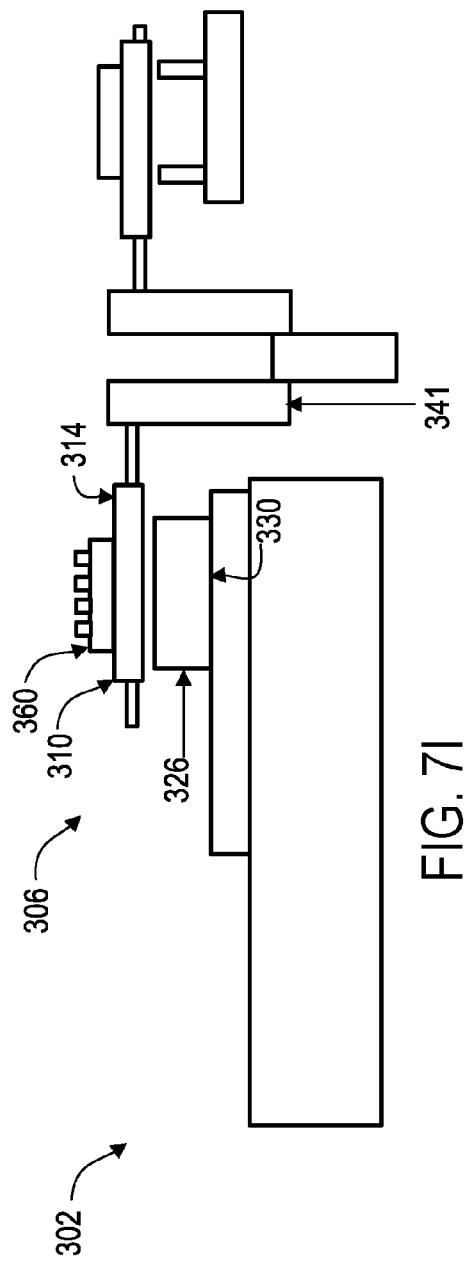

Referring to FIGS. 7A-7L, the substrate loading system 302 is shown facilitating loading and unloading of substrates to and from the pedestals 336 and the substrate chuck 326. Specifically, in some implementations, as shown in FIG. 7A, the first tray handler 306 engages with the first tray 310. In some examples, the first tray handler 306 engaging with the first tray 310 can include coupling the first tray handler 306 and the first tray 310. In some examples, the arms 309 of the first tray handler 306 engage with the first tray 310 at a perimeter of the first tray 310.

In some implementations, the substrate loading system 302 positions the tray handler device 304 to be in a first position. In some examples, positioning the tray handler device 304 in the first position includes having the cutouts 322 of the each of the apertures 318 of the first tray 310 in superimposition with respective pedestals 336 of the pedestal platform 334. In some examples, positioning the tray handler device 304 in the first position includes a distal end 354 of each of the pedestals 336 extend away from the top surface 314 of the first tray 310.

In some implementations, as shown in FIG. 7B, the actuator module 341 increases a distance between the top surface 314 of the first tray 310 and the top surface 337 of the pedestal platform 334. In some examples, increasing the distance between the top surface 314 of the first tray 310 and the top surface 337 of the pedestal platform 334 includes transferring a first substrate 360 from being positioned on the pedestals 336 to the tabs 324 defined by the apertures 318 of the first tray 310. In some examples, transferring the first substrate 360 from being positioned on the pedestals 336 to the tabs 324 defined by the apertures 318 of the first tray 310 includes transferring the first substrate 360 from being positioned on the pedestals 336 to the tabs 324 defined by the apertures 318 of the first tray 310 while the second tray handler 308 is engaging with the second tray 312. In some examples, the second tray handler 308 engaging with the second tray 312 can include coupling the second tray handler 308 and the second tray 312. In some examples, the arms 309 of the second tray handler 308 engage with the second tray 312 at a perimeter of the second tray 312.

In some examples, by transferring the first substrate 360 to the tabs 324 defined by the apertures 318 of the first tray 310, contact with the first substrate 360 is minimized. That is, by contacting the first substrate 360 with only the tabs 324 defined by the apertures 318 of the first tray 310, contact between such is minimized. By minimizing contact with the first substrate 360, e.g., by the tabs 324, introduction of possible defects to the first substrate 360 are minimized, as well as, minimizing particle contamination of the first substrate 360 by the tray handler device 302.

In some implementations, as shown in FIG. 7C, the actuator module 343 increases a distance between the top surface 316 of the second tray 312 and the bottom surface 330 of the substrate chuck 326. In some examples, increasing the distance between the top surface 316 of the second tray 312 and bottom surface 330 of the substrate chuck 326 includes transferring a second substrate 362 from being positioned on the substrate chuck 326 to the tabs 324 defined by the aperture 320 of the second tray 312. In some examples, the second substrate 326 includes a patterned layer 351 positioned thereon prior to transferring the second substrate 362 from the substrate chuck 326 to the tabs 324 defined by the aperture 320 of the second tray 312.

In some implementations, as shown in FIG. 7D, the rotational system 342 rotates the tray handler device 304 from the first position to a second position. Specifically, the rotational system 342 rotates the tray handler device 304 about the axis 344 such that the tray handler device 304 is in the second position. In some examples, positioning the tray handler device 304 in the second position includes having the tabs 324 defined by the apertures 318 of the first tray 310 in superimposition with the channels 332 of the substrate chuck 326. In some examples, positioning the tray handler device 304 in the second position includes having the cutouts 322 of each of the apertures 320 of the second tray 312 in superimposition with the respective pedestals 336 of the pedestal platform 334.

In some implementations, as shown in FIG. 7E, after the rotational system 342 rotates the tray handler device 304 from the first position to the second position, the actuator module 341 decreases a distance between the top surface 314 of the first tray 310 and the bottom surface 330 of the substrate chuck 326. In some examples, decreasing the distance between the top surface 314 of the first tray 310 and the bottom surface 330 of the substrate chuck 326 includes transferring the first substrate 360 from the tabs 324 defined by the aperture 318 of the first tray 310 to the top surface 322 of the substrate chuck 326 while the tabs 324 defined by the aperture 318 of the first tray 310 are disposed within the respective channels 332 of the substrate chuck 326.

In some implementations, as shown in FIG. 7F, the first tray handler 306 disengages from the first tray 310. That is, the first tray handler 306 disengaging from the first tray 310 can include decoupling the first tray handler 306 and the first tray 310. In some examples, the arms 309 of the first tray handler 306 disengage from the first tray 310 at the perimeter of the first tray 310. In some examples, the first tray handler 306 disengages from the first tray 310 while concurrently the actuator module 343 decreases a distance between the top surface 316 of the second tray 312 and the top surface 337 of the pedestal platform 334. In some examples, decreasing the distance between the top surface 316 of the second tray 312 and the top surface 337 of the pedestal platform 334 includes transferring the second substrate 362 from be positioned on the tabs 324 defined by the aperture 320 of the second tray 312 to the pedestals 336.

In some examples, after the first tray handler 306 disengages from the first tray 310, a patterning system, e.g., as shown in FIG. 1, forms a pattern in (or in a layer positioned on) the first substrate 360. Specifically, the air bearing 350 facilitates movement of the substrate chuck 326 about the support structure 352 in a direction away from the tray handler device 304 and towards the patterning system (not shown).

In some implementations, as shown in FIG. 7G, a robotic system (not shown) removes the second substrate 362 from being positioned on the pedestals 336. In some examples, the robotic system (not shown) positions a third substrate 364 on the pedestals 336. In some examples, after the first tray handler 304 disengages from the first tray 310, the patterning system (not shown) forms a patterned layer 370 positioned on the first substrate 360 while the first substrate 360 is positioned on the substrate chuck 326 and the first tray 310 is coupled to the substrate chuck 326.

In some implementations, as shown in FIG. 7H, after the patterning system (not shown) forms the patterned layer 370 positioned on the first substrate 360, the first tray handler 306 engages with the first tray 310. In some examples, the first tray handler 306 engaging with the first tray 310 can include coupling the first tray handler 306 and the first tray 310. In some examples, the arms 309 of the first tray handler 306 engage with the first tray 310 at a perimeter of the first tray 310. In some examples, concurrently with the first tray handler 306 engaging with the first tray 310, the actuator module 343 increases a distance between the top surface 316 of the second tray 312 and the top surface 337 of the pedestals platform 334. In some examples, increasing the distance between the top surface 316 of the second tray 312 and the top surface 337 of the pedestal platform 334 includes transferring the third substrate 364 from being positioned on the pedestals 336 to the tabs 324 defined by the aperture 320 of the second tray 312.

In some implementations, as shown in FIG. 7I, after the first tray handler 306 engages with the first tray 310, the actuator module 341 increases the distance between the top surface 314 of the first tray 310 and the bottom surface 330 of the substrate chuck 326. In some examples, increasing the distance between the top surface 314 of the first tray 310 and bottom surface 330 of the substrate chuck 326 includes transferring the first substrate 360 from being positioned on the substrate chuck 326 to the tabs 324 defined by the aperture 318 of the first tray 310.

Figure 7J:
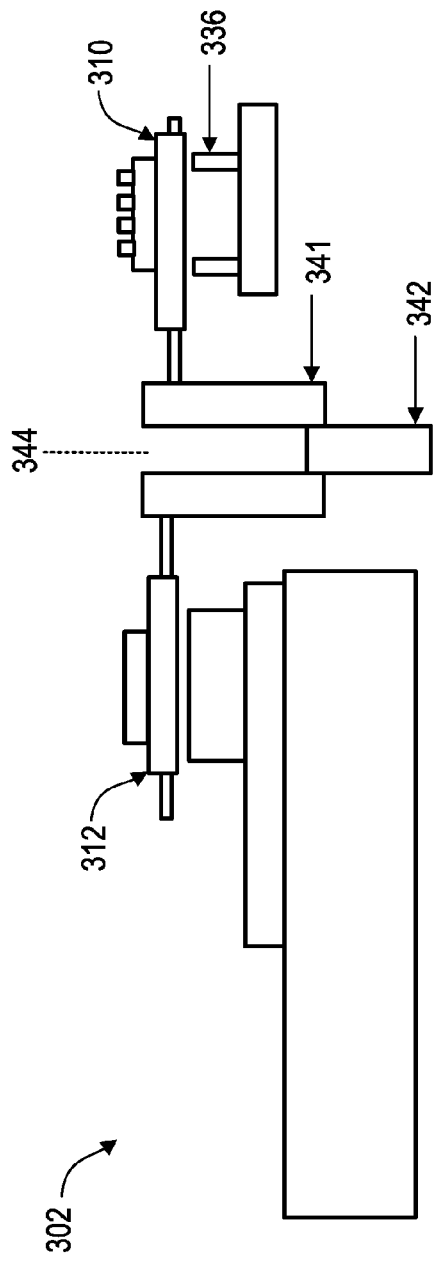

In some implementations, as shown in FIG. 7J, after the actuator module 341 increases the distance between the top surface 314 of the first tray 310 and the bottom surface 330 of the substrate chuck 326, the rotational system 342 rotates the tray handler device 304 from the second position to the first position. Specifically, the rotational system 342 rotates the tray handler device 304 about the axis 344 such that the tray handler device 304 is in the first position. In some examples, positioning the tray handler device 304 in the first position includes having the cutouts 322 of the aperture 318 of the first tray 310 in superimposition with respective pedestals 336 of the pedestal platform 334.

In some implementations, as shown in FIG. 7K, the actuator module 341 decreases the distance between the top surface 314 of the first tray 310 and the top surface 337 of the pedestal platform 334. In some examples, decreasing the distance between the top surface 314 of the first tray 310 and the top surface 337 of the pedestal platform 334 includes transferring the first substrate 360 from be positioned on the tabs 324 defined by the aperture 318 of the first tray 310 to the pedestals 336.

In some implementations, as shown in FIG. 7L, the actuator module 343 decreases a distance between the top surface 316 of the second tray 312 and the bottom surface 330 of the substrate chuck 326. In some examples, decreasing the distance between the top surface 316 of the second tray 312 and the bottom surface 330 of the substrate chuck 326 includes transferring the third substrate 364 from the tabs 324 defined by the aperture 320 of the second tray 312 to the top surface 322 of the substrate chuck 326 while the tabs 324 defined by the aperture 320 of the second tray 312 are disposed within the respective channels 332 of the substrate chuck 326.

In some examples, the second substrate 362 can be processed similar to that described above with respect to the first substrate 360, and specifically, that the process described in FIGS. 7A-7L can be applied to the second substrate 362. In some examples, any of the steps of FIGS. 7A-7L can happen serially, or in parallel.

For simplicity of illustration, a single first substrate 362, a single second substrate 364, a single third substrate 366 and a single substrate chuck 326 are shown; however the process of FIGS. 7A-7L can be applied to a plurality of first substrates 362, a plurality of second substrates 364, and a plurality of third substrate 366 with respect to a plurality of substrate chucks 326. That is, a plurality of first substrates 362, a plurality of second substrates 364, and a plurality of third substrate 366 can be subject to the process of FIGS. 7A-7L, concurrently. In some examples, the process of FIGS. 7A-7L of the substrate loading system 302 is associated with one complete exchange cycle of the substrates is 5.3 seconds, and the substrate loading system 302, specifically, the tray handler device 304, completes one revolution in 1.5 seconds. In some examples, the substrate loading system 302, and specifically, the rotational system 342 rotates the tray handler device 304 clockwise and/or counterclockwise.

Figure 8:
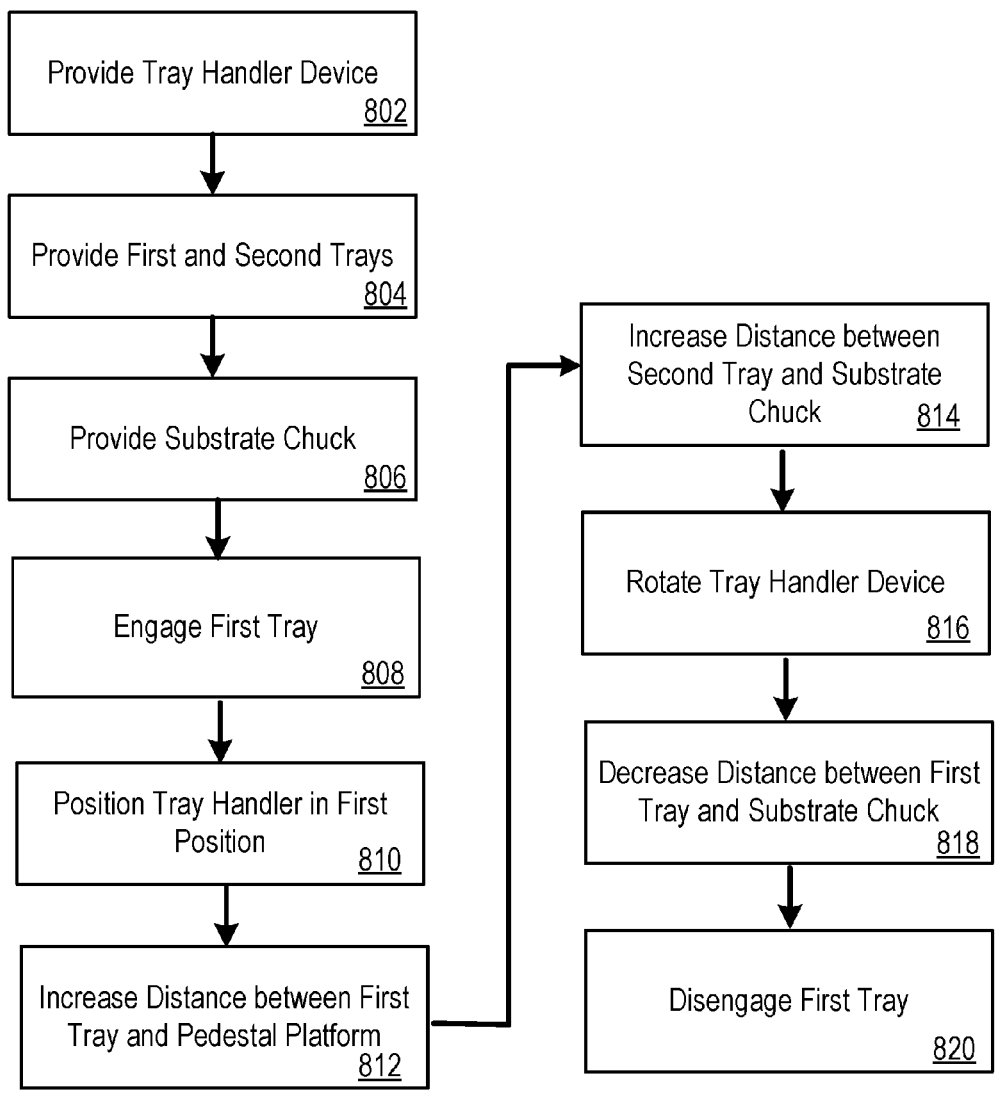
FIG. 8 illustrates an example method for loading and unloading of substrates to and from pedestals and the substrate chuck.

FIG. 8 illustrates an example method for loading and unloading of substrates to and from pedestals and the substrate chuck. The process 800 is illustrated as a collection of referenced acts arranged in a logical flow graph. The order in which the acts are described is not intended to be construed as a limitation, and any number of the described acts can be combined in other orders and/or in parallel to implement the process.

The tray handler device 304 is provided (802). In some examples, the tray handler device 304 includes the first tray handler 306 positioned opposite the second tray handler 308. The first tray 310 and the second tray 312 are provided (804). In some examples, the first tray 310 defines the apertures 318 and the second tray defines the aperture 320. In some examples, the first tray 310 has the top surface 314 and the second tray has the top surface 316. In some examples, each aperture 318, 320 defines at least two cutouts 322 and two tabs 324. The substrate chuck 326 is provided (806). In some examples, the substrate chuck 326 includes the top surface 328 and the bottom surface 330. The first tray handler 306 engages with the first tray 310 (808).

The tray handler device 304 is positioned in a first position (810). In some examples, positioning the tray handler device 304 in the first position includes having the cutouts 322 of the each of the apertures 318 of the first tray 310 in superimposition with respective pedestals 336 of the pedestal platform 334. In some examples, positioning the tray handler device 304 in the first position includes the distal end 354 of each of the pedestals 336 extending away from the top surface 314 of the first tray 310.

The distance between the top surface 314 of the first tray 310 and the top surface 337 of the pedestal platform 334 is increased (812). For example, the actuator module 341 increases the distance between the top surface 314 of the first tray 310 and the top surface 337 of the pedestal platform 334. In some examples, increasing the distance between the top surface 314 of the first tray 310 and the top surface 337 of the pedestal platform 334 includes transferring the first substrate 360 from being positioned on the pedestals 336 to the tabs 324 defined by the apertures 318 of the first tray 310. In some examples, transferring the first substrate 360 from being positioned on the pedestals 336 to the tabs 324 defined by the apertures 318 of the first tray 310 includes transferring the first substrate 360 from being positioned on the pedestals 336 to the tabs 324 defined by the aperture 318 of the first tray 310 while the second tray handler 308 is engaging with the second tray 312.

The distance between the top surface 316 of the second tray 312 and the bottom surface 330 of the substrate chuck 326 is increased (814). For example, the actuator module 343 increases the distance between the top surface 316 of the second tray 312 and the bottom surface 330 of the substrate chuck 326. In some examples, increasing the distance between the top surface 316 of the second tray 312 and bottom surface 330 of the substrate chuck 326 includes transferring the second substrate 362 from being positioned on the substrate chuck 326 to the tabs 324 defined by the aperture 320 of the second tray 312.

The tray handler device 302 rotates from the first position to the second position (816). For example, the rotational system 342 rotates the tray handler device 302 from the first position to a second position. In some examples, positioning the tray handler device 302 in the second position includes having the tabs 324 defined by the apertures 318 of the first tray 310 in superimposition with the channels 332 of the substrate chuck 326. In some examples, positioning the tray handler device 302 in the second position includes having the cutouts 322 of each of the apertures 320 the second tray 312 in superimposition with the respective pedestals 336 of the pedestal platform 334.

The distance between the top surface 314 of the first tray 310 and the bottom surface 330 of the substrate chuck 326 is decreased (818). For examples, the actuator module 341 decreases the distance between the top surface 314 of the first tray 310 and the bottom surface 330 of the substrate chuck 326. In some examples, decreasing the distance between the top surface 314 of the first tray 310 and the bottom surface 330 of the substrate chuck 326 includes transferring the first substrate 360 from the tabs 324 defined by the aperture 318 of the first tray 310 to the top surface 322 of the substrate chuck 328 while the tabs 324 defined by the aperture 318 of the first tray 310 are disposed within the respective channels 332 of the substrate chuck 326.

The first tray handler 306 disengages from the first tray 310 (820). In some examples, the first tray handler 306 disengages from the first tray 310 while concurrently the actuator module 343 decreases a distance between the top surface 316 of the second tray 312 and the top surface 337 of the pedestal platform 334. In some examples, decreasing the distance between the top surface 316 of the second tray 312 and the top surface 337 of the pedestal platform 334 includes transferring the second substrate 362 from be positioned on the tabs 324 defined by the aperture 320 of the second tray 312 to the pedestals 336.

The invention claimed is:

1. An imprint lithography substrate transfer method, comprising:
providing a tray handler device including a first tray handler positioned opposite a second tray handler;
providing a first tray and a second tray, each of the first and the second trays defining an aperture and each having a top surface, each aperture defining at least two cutouts and two tabs;
providing a substrate chuck having a top surface and a bottom surface;
engaging the first tray handler with the first tray;
positioning the tray handler device in a first position with i) the cutouts of the aperture of the first tray in superimposition with respective pedestals of a pedestal platform and ii) a distal end of the pedestals extending away from the top surface of the first tray;
increasing a distance between the top surface of the first tray and a top surface of the pedestal platform to transfer a first substrate from the pedestals to the tabs defined by the aperture of the first tray, while concurrently engaging the second tray handler with the second tray;
increasing a distance between the top surface of the second tray and the bottom surface of the substrate chuck to transfer a second substrate from the substrate chuck to the tabs defined by the second tray;
rotating the tray handler device from the first position to a second position with i) the tabs defined by the aperture of the first tray in superimposition with respective channels of the substrate chuck and ii) the cutouts of the aperture of the second tray in superimposition with respective pedestals;
decreasing a distance between the top surface of the first tray and the bottom surface of the substrate chuck to transfer the first substrate from the tabs defined by the aperture of the first tray to the top surface of the substrate chuck while the tabs defined by the aperture of the first tray are disposed within the respective channels of the substrate chuck; and disengaging the first tray handler from the first tray while concurrently decreasing a distance between the top surface of the second tray and the top surface of the pedestal platform to transfer the second substrate from the tabs defined by the aperture of the second tray to the pedestals.

2. The method of claim 1, further comprising:
removing the second substrate from being positioned on the pedestals;
positioning a third substrate on the pedestals;
and after disengaging the first tray handler from the first tray, forming a pattern in a material positioned on the first substrate while the first substrate is positioned on the substrate chuck and the first tray is coupled with the substrate chuck.

3. The method of claim 2, further comprising:
after forming the pattern in the material positioned on the first substrate, engaging the first tray handler with the first tray while concurrently increasing the distance between the top surface of the second tray and the top surface of the pedestal platform to transfer the third substrate from the pedestals to the tabs defined by the aperture of the second tray.

4. The method of claim 3, further comprising:
after engaging the first tray handler with the first tray, increasing the distance between the top surface of the first tray and the bottom surface of the substrate chuck to transfer the first substrate from the substrate chuck to the tabs of defined by the first tray.

5. The method of claim 4, further comprising:
after increasing the distance between the top surface of the first tray and the bottom surface of the substrate chuck, rotating the tray handler device from the second position to the first position with the cutouts of the aperture of the first tray in superimposition with respective pedestals of the pedestal platform.

6. The method of claim 5, further comprising decreasing the distance between the top surface of the first tray and the top surface of the pedestal platform to transfer the first substrate from the tabs defined by the aperture of the first tray to the pedestals.

7. The method of claim 6, further comprising decreasing the distance between the top surface of the second tray and the bottom surface of the substrate chuck to transfer the third substrate from the tabs defined by the aperture of the second tray to the top surface of the substrate chuck while the tabs defined by the aperture of the second tray are disposed within the respective channels of the substrate chuck.

8. The method of claim 1, wherein the second substrate includes a patterned layer positioned thereon prior to transferring the second substrate from the substrate chuck to the tabs defined by the second tray.

9. An imprint lithography system, comprising:
two or more pedestals of a pedestal platform;
a substrate chuck having a top surface and a bottom surface, and including channels;
a first tray and a second tray, each of the first and the second trays defining an aperture and each having a top surface, each aperture defining at least two cutouts and two tabs;
a tray handler device including a first tray handler positioned opposite a second tray handler, the first tray handler engageable with the first tray and the second tray handler engageable with the second tray, the tray handler device rotatable between first and second positions, the first position having i) the cutouts of the aperture of the first tray in superimposition with respective pedestals of the pedestal platform and ii) a distal end of the pedestals extending away from the top surface of the first tray, the second position having i) the tabs defined by the aperture of the first tray in superimposition with respective channels of the substrate chuck and ii) the cutouts of the aperture of the second tray in superimposition with respective pedestals; and an actuator system to, when the tray handler device is in the first position, i) increase a distance between the top surface of the first tray and a top surface of the pedestal platform to transfer a first substrate from the pedestals to the tabs defined by the aperture of the first tray, while concurrently engaging the second tray handler with the second tray, and ii) increase a distance between the top surface of the second tray and the bottom surface of the substrate chuck to transfer a second substrate from the substrate chuck to the tabs defined by the second tray, and when the tray handler is in the second position, i) decrease a distance between the top surface of the first tray and the bottom surface of the substrate chuck to transfer the first substrate from the tabs defined by the aperture of the first tray to the top surface of the substrate chuck while the tabs defined by the aperture of the first tray are disposed within the respective channels of the substrate chuck, and ii) decrease a distance between the top surface of the second tray and the top surface of the pedestal platform to transfer the second substrate from the tabs defined by the aperture of the second tray to the pedestals while the first tray handler is disengaged from the first tray.

10. The system of claim 9, further comprising a rotational system to rotate the tray handler device between the first and the second positions.

11. The system of claim 9, further comprising a patterning system to form a pattern in the first substrate when the first substrate is positioned on the top surface of the substrate chuck.

12. The system of claim 9, the actuator system comprising a first actuator module to, when the tray handler device is in the first position, increase the distance between the top surface of the first tray and a top surface of the pedestal platform to transfer a first substrate from the pedestals to the tabs defined by the aperture of the first tray, while concurrently engaging the second tray handler with the second tray, and to, when the tray handler device is in the second position, decrease the distance between the top surface of the first tray and the bottom surface of the substrate chuck to transfer the first substrate from the tabs defined by the aperture of the first tray to the top surface of the substrate chuck while the tabs defined by the aperture of the first tray are disposed within the respective channels of the substrate chuck.

13. The system of claim 12, the actuator system comprising a second actuator module to, when the tray handler is in the first position, increase a distance between the top surface of the second tray and the bottom surface of the substrate chuck to transfer a second substrate from the substrate chuck to the tabs defined by the second tray, and to, when the tray handler is in the second position, and when the tray handler device is in the second position, decrease the distance between the top surface of the second tray and the top surface of the pedestal platform to transfer the second substrate from the tabs defined by the aperture of the second tray to the pedestals while the first tray handler is disengaged from the first tray.

* * * * *